US012155180B2

(12) United States Patent
Yasunaga et al.

(10) Patent No.: US 12,155,180 B2
(45) Date of Patent: Nov. 26, 2024

(54) IGNITER

(71) Applicant: DIAMOND&ZEBRA ELECTRIC MFG. CO., LTD., Osaka (JP)

(72) Inventors: Masatoshi Yasunaga, Osaka (JP); Kouji Hiragi, Osaka (JP); Yoshifumi Sasaki, Osaka (JP)

(73) Assignee: DIAMOND & ZEBRA ELECTRIC MFG. CO., LTD., Osaka (JP)

( * ) Notice: Subject to any disclaimer, the term of this patent is extended or adjusted under 35 U.S.C. 154(b) by 0 days.

(21) Appl. No.: 17/023,076

(22) Filed: Sep. 16, 2020

(65) Prior Publication Data

US 2021/0194220 A1 Jun. 24, 2021

(30) Foreign Application Priority Data

Dec. 23, 2019 (JP) .................................. 2019-231552

(51) Int. Cl.
 *H01T 15/00* (2006.01)
(52) U.S. Cl.
 CPC .................................... *H01T 15/00* (2013.01)
(58) Field of Classification Search
 CPC ............... H01T 15/00; H01L 23/49575; H01L 23/49565; H01L 23/49541; H01L 23/49551; H01L 23/4951

(Continued)

(56) References Cited

U.S. PATENT DOCUMENTS 4,312,011 A * 1/1982 Kanbayashi ........ H01L 27/0825
257/652
5,338,971 A * 8/1994 Casati ............... H01L 23/49541
257/E23.092

(Continued)

FOREIGN PATENT DOCUMENTS

CN 1449036 A 10/2003
CN 1451862 A 10/2003

(Continued)

OTHER PUBLICATIONS

Chinese Office Action issued in corresponding Chinese Patent Application No. 202011541367.6, dated Jun. 2, 2022, with English translation.

(Continued)

*Primary Examiner* — Logan M Kraft
*Assistant Examiner* — Joshua Campbell
(74) *Attorney, Agent, or Firm* — Rimon P.C.

(57) ABSTRACT

An igniter controls a current flowing in a coil unit for supplying a high voltage to a spark plug for use in an internal combustion engine. The igniter includes: a pyrogenic power element, a metal block, a lead frame, and a controller. The lead frame electrically connects the metal block and the coil unit to each other. The controller controls the operation of the power element. The power element is fixed directly to the metal block by soldering at a surface of the power element on one side, and is electrically connected to the controller at a surface of the power element on the other side. With this configuration, heat generated during the operation of the power element is transferred smoothly in a moment to the metal block. As a result, temperature increase at the power element is suppressed during the operation of the power element.

6 Claims, 6 Drawing Sheets

(58) Field of Classification Search
USPC .................................. 315/209 T; 257/99
See application file for complete search history.

(56) References Cited

U.S. PATENT DOCUMENTS

| | | | | |
|---|---|---|---|---|
| 5,598,034 | A * | 1/1997 | Wakefield | H01L 23/315 |
| | | | | 257/E23.128 |
| 6,378,514 | B1 * | 4/2002 | Kaminaga | H01F 38/12 |
| | | | | 123/634 |
| 6,851,417 | B2 * | 2/2005 | Katayama | F02P 3/02 |
| | | | | 123/634 |
| 2002/0012230 | A1 * | 1/2002 | Oishi | F02P 3/0552 |
| | | | | 361/704 |
| 2002/0109211 | A1 | 8/2002 | Shinohara | |
| 2003/0183907 | A1 | 10/2003 | Hayashi et al. | |
| 2003/0192519 | A1 | 10/2003 | Katayama et al. | |
| 2004/0108602 | A1 * | 6/2004 | Nakajima | H01L 23/3121 |
| | | | | 257/E23.044 |
| 2005/0151229 | A1 | 7/2005 | Imaizumi et al. | |
| 2010/0289128 | A1 * | 11/2010 | Camacho | H01L 23/4951 |
| | | | | 257/E21.705 |
| 2014/0188369 | A1 * | 7/2014 | Torrisi | F02P 17/12 |
| | | | | 701/102 |
| 2016/0254215 | A1 * | 9/2016 | Sato | H01L 21/52 |
| | | | | 257/668 |

FOREIGN PATENT DOCUMENTS

| | | | | |
|---|---|---|---|---|
| CN | 102820288 | A | 12/2012 | |
| JP | 04026149 | A * | 1/1992 | ............. H01L 24/81 |
| JP | 2002-184799 | A | 6/2002 | |
| JP | 2002-260936 | A | 9/2002 | |
| JP | 2002-334811 | A | 11/2002 | |
| JP | 2005-150209 | A | 6/2005 | |
| JP | 2005-229090 | A | 8/2005 | |
| JP | 4286465 | B2 | 7/2009 | |

OTHER PUBLICATIONS

Japanese Notice of Reasons for Refusal issued in corresponding Japanese Patent Application No. 2019-231552, dated Sep. 5, 2023, with English translation.

* cited by examiner

IGNITER

RELATED APPLICATIONS

This application claims the benefit of Japanese Application No. 2019-231552, filed on Dec. 23, 2019, the disclosure of which is incorporated by reference herein.

BACKGROUND OF THE INVENTION

Field of the Invention

The present invention relates to an igniter that controls a current flowing in a coil unit for supplying a high voltage to a spark plug for use in an internal combustion engine.

Description of the Background Art

A vehicle body such as that of an automobile is conventionally provided with an ignition device for use in an internal combustion engine. The ignition device increases a DC low voltage supplied from a battery to as high as some thousands of volts at a coil unit under control by an engine control unit (ECU), and supplies the increased voltage to a spark plug. By doing so, an electric spark is generated to ignite fuel.

The ignition device is provided with a circuit board with a power element for controlling a current flowing in a primary coil L1 in a coil unit. For example, an IGBT is used as the power element. The power element has pyrogenic properties. When the ignition device comes into operation, the power element generates heat instantaneously to be placed in a high temperature. Repeating such instantaneous heat generation causes a risk of a break or a crack at a connection between the power element and a peripheral member. Hence, a technique of suppressing temperature increase at the power element has been desired. A conventional configuration of suppressing temperature increase at the power element is disclosed in Japanese Patent No. 4286465, for example.

Japanese Patent No. 4286465 discloses a semiconductor device including a power element (1), a lead frame (2a) having a shape like a thin plate, a metal block (5) made of aluminum or copper, and a resin package (6). The power element (1) is fixed to the lead frame (2a) with solder (9). The metal block (5) is arranged on the opposite side of the power element (1) across the lead frame (2a). The metal block (5) has a protrusion of a shape protruding toward the lead frame (2a). The metal block (5) is bonded to the lead frame (2a) at the protrusion with a bonding material (10) (solder, for example). The resin package (6) seals the power element (1), a part of the lead frame (2a), and the metal block (5). An external heat dissipator (11) is attached to a part of the resin package (6) in the vicinity of the metal block (5). Heat generated at the power element (1) passes through the solder (9), the lead frame (2a), the bonding material (10), the metal block (5), and the resin package (6) to be dissipated to the outside from the external heat dissipator (11).

In the configuration of Japanese Patent No. 4286465, a plurality of members is present between the power element (1) and the external heat dissipator (11). A plurality of members is also present between the power element (11) and the metal block (5) around the external heat dissipator (11). Further, the power element (1) is bonded only to the protrusion of the metal block (5) through the solder (9), the lead frame (2a), and the bonding material (10). The protrusion mentioned herein is a minor part of the metal block (5). As a result, heat generated during the operation of the power element (1) is hindered from being transferred smoothly to the metal block (5) to cause a risk of raising the power element (1) to a high temperature.

SUMMARY OF THE INVENTION

The present invention is intended to provide a technique allowing suppression of temperature increase at a power element by transferring heat generated during the operation of the power element to a metal block smoothly in a moment.

To solve the foregoing problem, a first aspect of the present invention is intended for an igniter that controls a current flowing in a coil unit for supplying a high voltage to a spark plug for use in an internal combustion engine. The igniter includes: a pyrogenic power element; a metal block; a lead frame electrically connecting the metal block and the coil unit to each other; and a controller that controls the operation of the power element. The power element is fixed to the metal block by soldering at a surface of the power element on one side, and is electrically connected to the controller at a surface of the power element on the other side.

According to the first aspect of the present invention, the power element is fixed directly to the metal block by soldering. With this configuration, heat generated during the operation of the power element is transferred smoothly in a moment to the metal block. As a result, temperature increase at the power element is suppressed.

DESCRIPTION OF THE PREFERRED EMBODIMENTS

Figure 1:
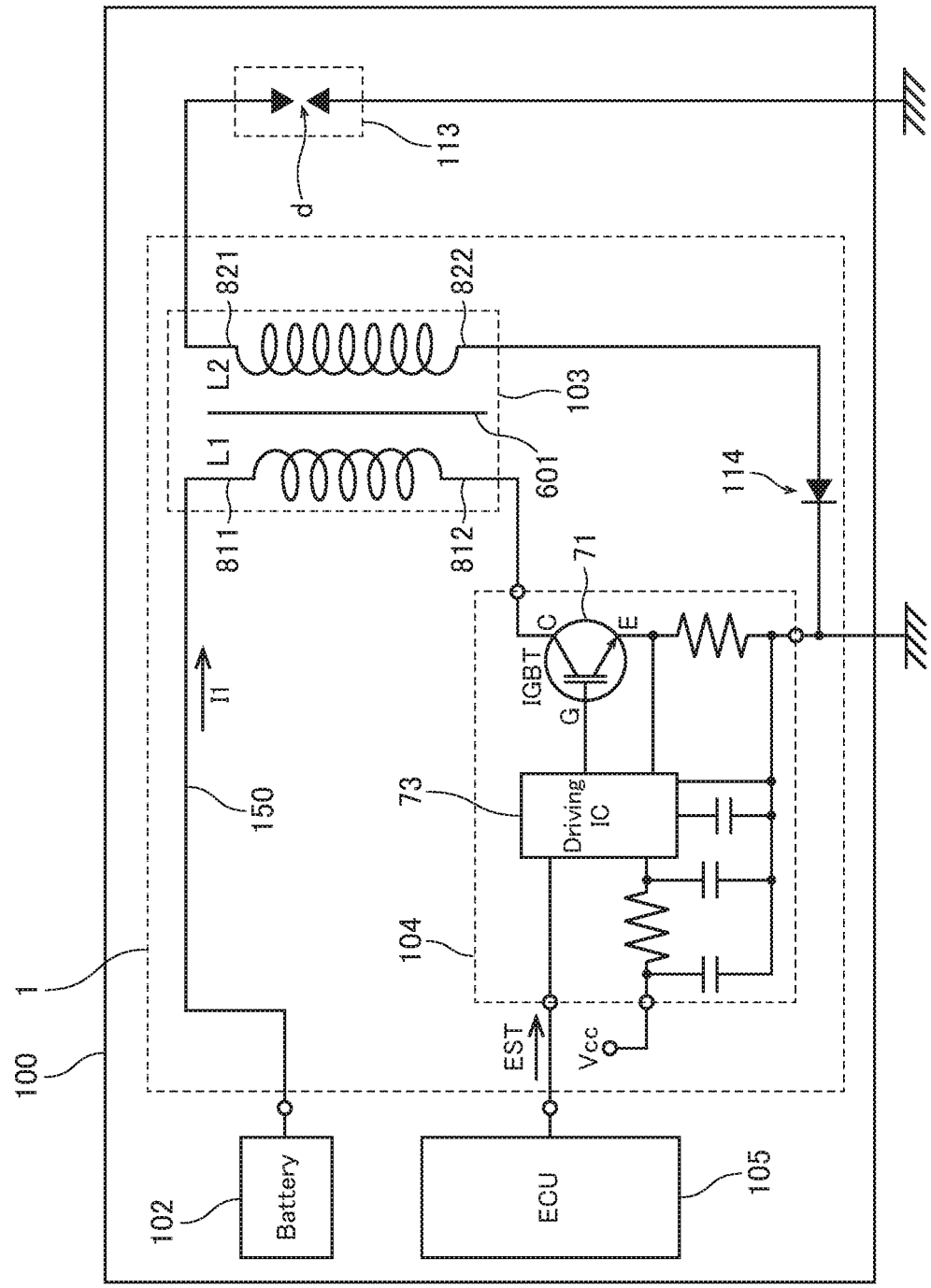
FIG. 1 is a block diagram schematically showing an operating environment of an ignition device according to a first preferred embodiment.

An exemplary preferred embodiment of the present invention will be described below by referring to the drawings.

1. First Preferred Embodiment

<1-1. Configuration of Ignition Device>

The configuration of an ignition device 1 corresponding to a first preferred embodiment of the present invention will be described first by referring to the drawings. FIG. 1 is a block diagram schematically showing an operating environment of the ignition device 1 according to the first preferred embodiment. As described later, a primary coil L1 and a secondary coil L2 in a coil unit 103 in the ignition device 1 are arranged in directions in which these coils are stacked on each other.

To facilitate understanding, however, these coils are illustrated in positions adjacent to each other in FIG. 1.

The ignition device 1 of the first preferred embodiment is a device installed on a vehicle body 100 of a vehicle such as an automobile, for example, and used for applying a high voltage for generating spark discharge at a spark plug 113 for use in an internal combustion engine. As shown in FIG. 1, the vehicle body 100 includes the spark plug 113, a battery 102, and an engine control unit (ECU) 105, in addition to the ignition device 1. The ignition device 1 of the first preferred embodiment includes the coil unit 103 and an igniter 104 described later.

The spark plug 113 is connected to one end 821 of the secondary coil L2 described later in the coil unit 103. When a high voltage is induced in the secondary coil L2 in the coil unit 103, discharge occurs at a gap d in the spark plug 113 to generate a spark. As a result, fuel filling an internal combustion engine is ignited.

The battery 102 is a power supply capable of being charged and discharged with DC power. Namely, the battery 102 is a storage battery. In the first preferred embodiment, the battery 102 is electrically connected to the primary coil L1 described later in the coil unit 103. The battery 102 supplies a DC voltage to the primary coil L1 in the coil unit 103.

Figure 2:
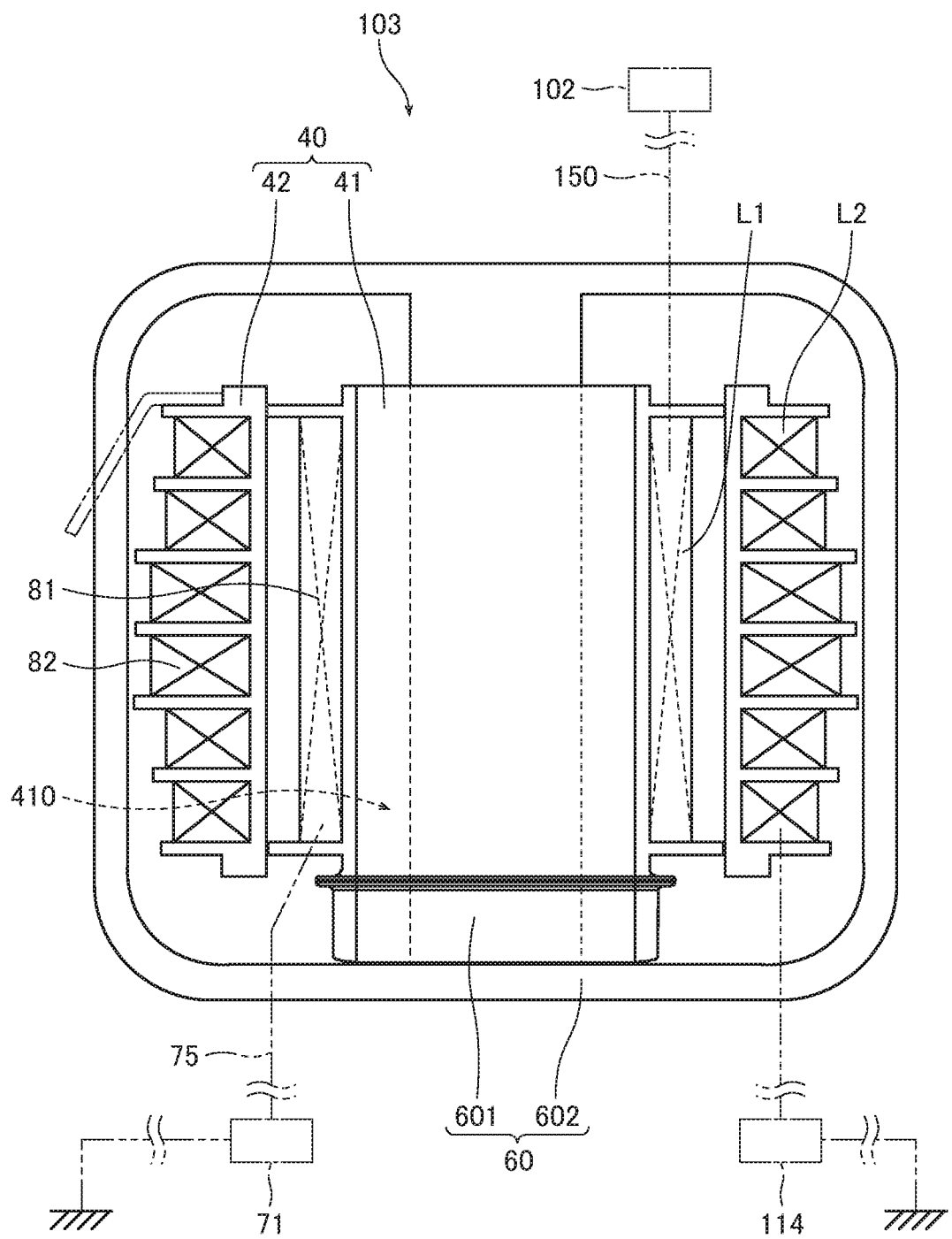
FIG. 2 is a plan view of a coil unit according to the first preferred embodiment.

FIG. 2 is a plan view of the coil unit 103. As shown in FIG. 2, the coil unit 103 includes a bobbin 40, the primary coil L1, the secondary coil L2, and an iron core 60. In the description of the coil unit 103 given below, a direction parallel to the center axis of the bobbin 40, a direction perpendicular to the center axis of the bobbin 40, and a direction along an arc centered on the center axis of the bobbin 40 will be called an "axis direction," a "radial direction," and a "peripheral direction" respectively. The "parallel direction" mentioned herein includes a substantially parallel direction, and the "perpendicular direction" mentioned herein includes a substantially perpendicular direction.

The bobbin 40 includes a primary bobbin 41 and a secondary bobbin 42 connectable to each other. Each of the primary bobbin 41 and the secondary bobbin 42 extends in a tubular shape in the axis direction. The secondary bobbin 42 is arranged external to the primary bobbin 41 in the radial direction. The primary bobbin 41 and the secondary bobbin 42 are made of resin, for example.

The primary coil L1 is formed by winding a conductor in the peripheral direction on the outer peripheral surface of the primary bobbin 41. This conductor will hereinafter be called a "primary conductor 81." After formation of the primary coil L1 is finished, the secondary bobbin 42 is arranged to cover the outer peripheral surface of the primary coil L1. Then, a conductor different from the primary conductor 81 is wound on the outer peripheral surface of the secondary bobbin 42 to form the secondary coil L2. This different conductor will hereinafter be called a "secondary conductor 82." In this way, the primary coil L1 and the secondary coil L2 are arranged to be stacked on each other to achieve size reduction of the coil unit 103 in its entirety including the primary coil L1 and the secondary coil L2. The primary coil L1 and the secondary coil L2 are not always required to be formed by winding to be arranged in positions stacked on each other but may alternatively be arranged in positions adjacent to each other as shown in FIG. 1.

As shown in FIG. 2, the iron core 60 has a configuration with a center iron core 601 and an outer iron core 602 combined together. Each of the center iron core 601 and the outer iron core 602 is formed of a stacked steel plate with a stack of silicon steel plates, for example. The center iron core 601 extends in the axis direction. The center iron core 601 is passed through space 410 inside the primary bobbin 41 in the radial direction. The outer iron core 602 is arranged external to the secondary coil L2 in the radial direction. The outer iron core 602 connects the opposite ends of the center iron core 601 in the axis direction. In this way, the iron core 60 forms a closed magnetic circuit configuration in which the primary coil L1 and the secondary coil L2 are electromagnetically coupled to each other.

The primary conductor 81 forming the primary coil L1 has one end 811 to which a conductor extending from the battery 102 is connected. This conductor extending from the battery 102 will hereinafter be called a "power supply line 150." The primary conductor 81 has the other end 812 connected to a switch 71 through a lead frame 75 of the igniter 104 described later. In this configuration, when the switch 71 is closed, a DC low voltage from the battery 102 is applied to the one end 811 of the primary coil L1. Then, a primary current I1 starts to flow in the primary coil L1 in such a manner as to increase gradually.

The one end 821 of the secondary conductor 82 forming the secondary coil L2 is connected to the spark plug 113. The secondary conductor 82 has a diameter less than that of the primary conductor 81. The number of turns of the secondary conductor 82 of the secondary coil L2 (10000 turns, for example) is about 100 times or more the number of turns (100 turns, for example) of the primary conductor 81 of the primary coil L1. With this configuration, during interruption of the primary current IL the coil unit 103 increases DC low-voltage power supplied from the battery 102 to as high as some thousands of volts. Namely, a high voltage is induced in the secondary coil L2. Then, the secondary coil L2 supplies the induced high-voltage power to the spark plug 113. By doing so, an electric spark is generated at the spark plug 113 to ignite fuel.

As shown in FIG. 1, in the first preferred embodiment, the secondary coil L2 has the other end 822 to which a diode 114 is connected further in series with the secondary coil L2 in such a manner that a direction toward the ground is a forward direction. The other end 822 mentioned herein is an end of the secondary coil L2 on the opposite side of the one end 821 to which the spark plug 113 is connected. This prevents an induced current resulting from the voltage induced in the secondary coil L2 by the gradually increasing primary current I1 from flowing in the reverse direction toward the spark plug 113.

The igniter 104 is a semiconductor device connected to the primary coil L1 and used for controlling a current flowing in the primary coil L1. The igniter 104 is electrically connected to the ECU 105 and receives a signal from the ECU 105. The signal received from the ECU 105 will hereinafter be called an "EST signal." The igniter 104 may be integrated with an electronic circuit of the ECU 105. A specific configuration of the igniter 104 and a method of connection between the igniter 104 and each part of the ignition device 1 will be described later.

The ECU 105 is an existing computer that controls the motions of a transmission, an air bag, etc. of the vehicle body 100 comprehensively.

<1-2. Specific Configuration of Igniter and Method of Connection between Igniter and Each Part of Ignition Device>

A specific configuration of the igniter 104 and a method of connection between the igniter 104 and each part of the ignition device 1 will be described next.

Figure 3:
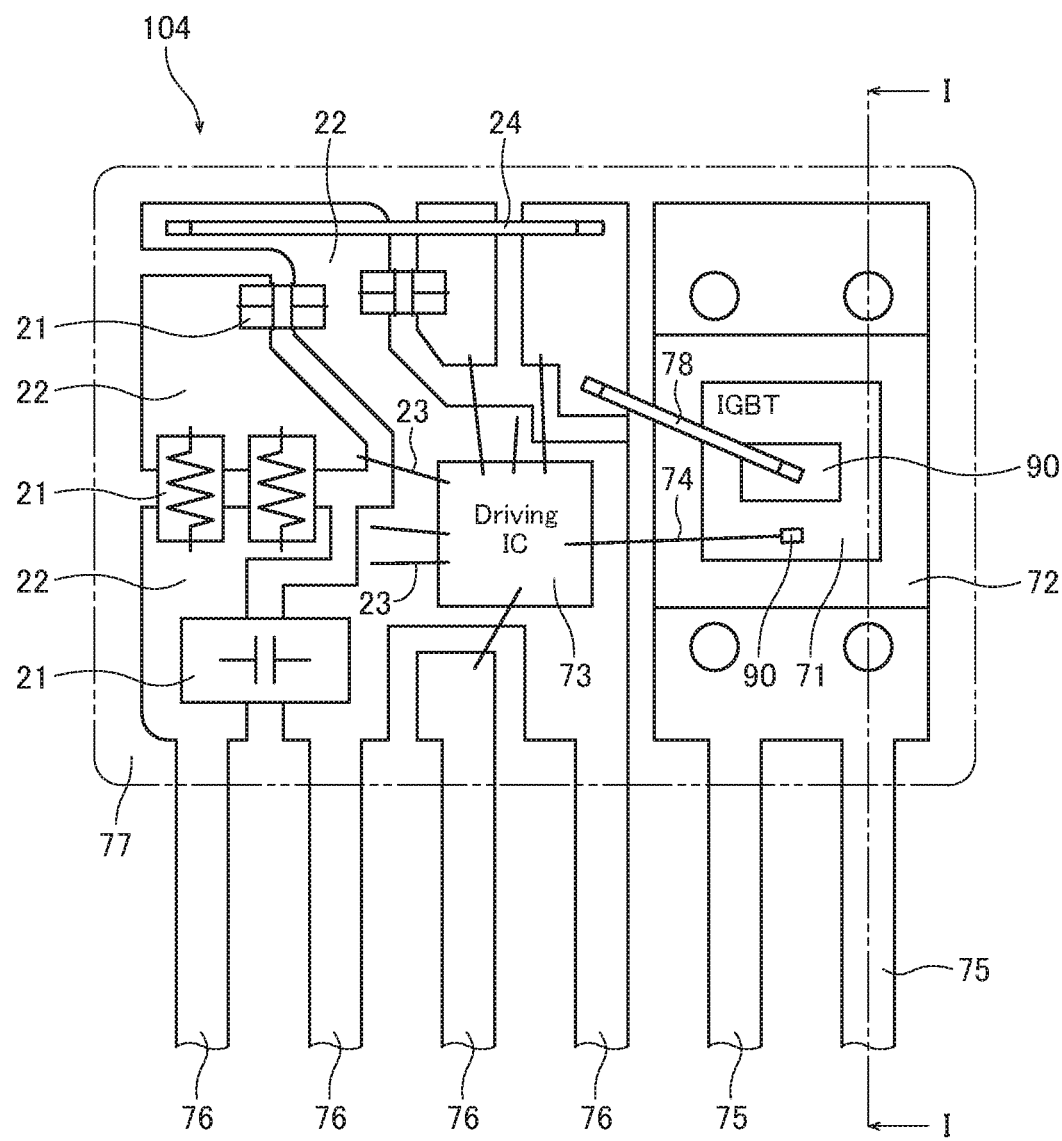
FIG. 3 is a plan view schematically showing the configuration of an igniter according to the first preferred embodiment.
Figure 3:
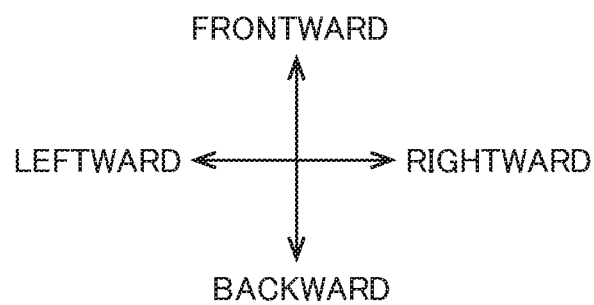

FIG. 3 is a plan view (top view) schematically showing the configuration of the igniter 104. As shown in FIG. 3, the igniter 104 includes the switch 71, a metal block 72, a driving IC 73, a wire 74 (a gold wire 74 of a diameter from 15 to 50 μm), the lead frame 75, a plurality of different lead frames 76, a casing 77, a wire 78 (an aluminum wire 78 of a diameter from 125 to 500 μm), a plurality of different elements 21 (including a capacitor and a resistor), a plurality of different connection members 22 (including interconnect lines forming parts of the different lead frames 76), and a plurality of different wires 23 and 24 (including gold wires 23 of diameters from 15 to 50 μm and an aluminum wire 24 of a diameter from 125 to 500 μm further functioning as a resistor). As the switch 71, the metal block 72, the driving IC 73, the wire 74, a part of the lead frame 75, the different lead frames 76, the wire 78, the different elements 21, the different connection members 22, and the different wires 23 and 24 are covered by molding resin forming the casing 77, they are visually unrecognizable from outside. To facilitate understanding, however, these elements are indicated by solid lines and the casing 77 is indicated by a line with alternate long and two short dashes in FIG. 3. For the convenience of description, the igniter 104 will be described in the subsequent paragraphs in terms of the shape of each part and the positions of parts relative to each other on condition that the switch 71 is on the upper side relative to the metal block 72, and a "front-back direction" and a "right-left direction" are defined as shown in FIG. 3. However, these definitions are not intended to limit the posture of the igniter 104 according to the present invention during manufacture and during use of the igniter 104.

For example, an insulated-gate bipolar transistor (IGBT) is used as the switch 71. The switch 71 is made of silicon. However, the switch 71 may be made of a different semiconductor material such as silicon carbide. The switch 71 is a pyrogenic power element and generates heat instantaneously to be placed in a high temperature when the ignition device 1 comes into operation. The switch 71 generates heat to be placed in a high temperature within one msec, for example. The switch 71 is arranged on a path of a current flowing in the primary coil L1. More specifically, the switch 71 is interposed between the primary coil L1 and the ground. The switch 71 has a collector (C) connected to the other end 812 of the primary coil L1 described above. The switch 71 has an emitter (E) connected to the ground. The switch 71 has a gate (G) connected to the driving IC 73. By doing so, the switch 71 becomes functional to switch between passage and interruption of the primary current I1 flowing from the battery 102 into the ground through the primary coil L1. A different type of transistor may be used for forming the switch 71. A material different from silicon may be used for forming the switch 71. In the first preferred embodiment, the switch 71 is required to be made of silicon at least in a part including an area to which an aluminum electrode 90 described later is fixed and its surrounding area.

Figure 4:
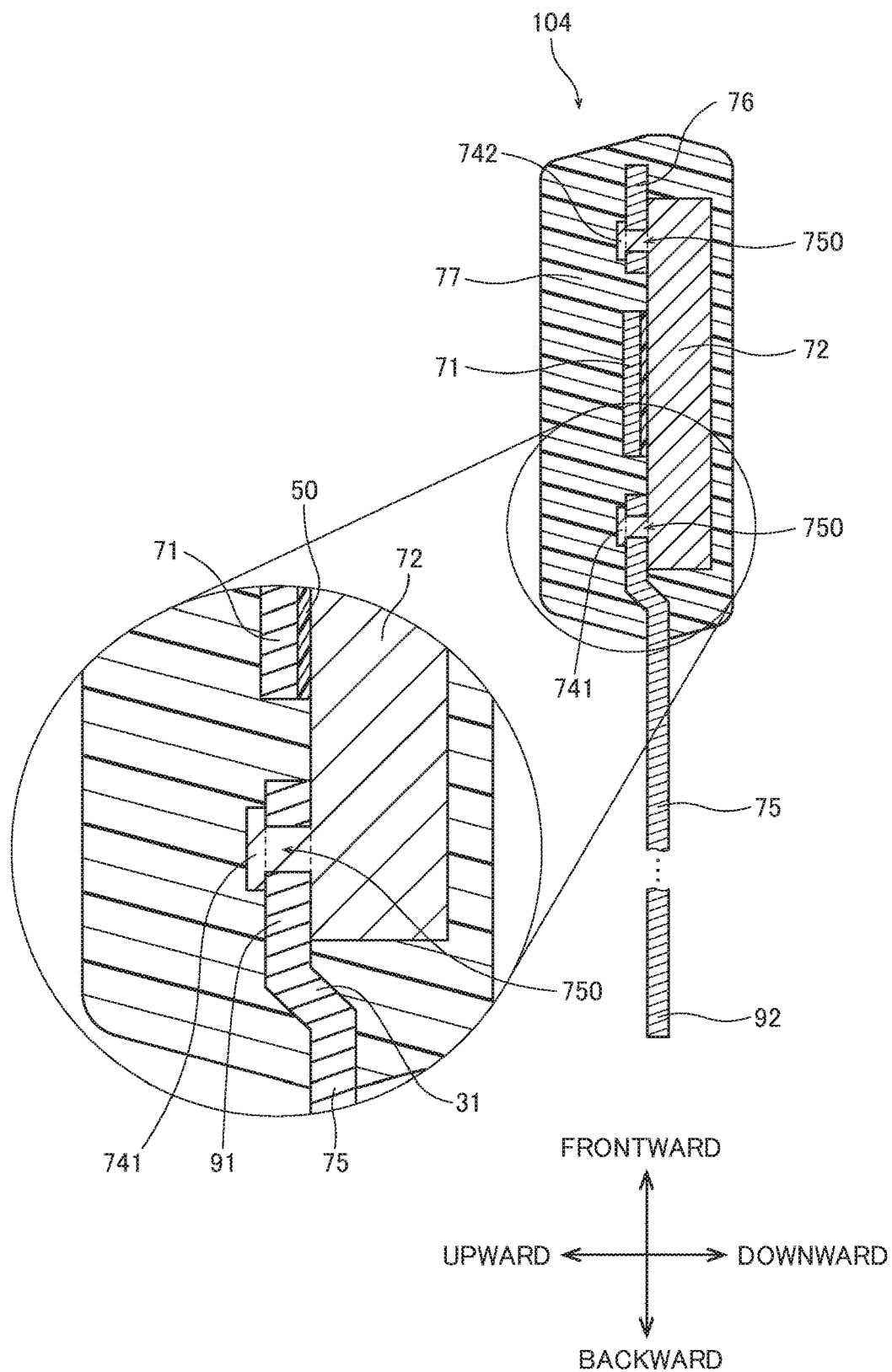
FIG. 4 is a vertical sectional view of the igniter according to the first preferred embodiment.

FIG. 4 is a vertical sectional view of the igniter 104 taken at a position I-I in FIG. 3 from the right direction. As shown in FIG. 4, the switch 71 is fixed directly to the metal block 72 at the lower surface of the switch 71 by soldering using solder 50 made of a tin alloy, for example. The volume and mass of the metal block 72 are significantly greater than the volume and mass of the switch 71. For this reason, the metal block 72 has thermal capacity significantly greater than that of the switch 71. Thus, heat generated instantaneously when the switch 71 comes into operation is transferred to the metal block 72 and absorbed in the metal block 72. As a result, temperature increase at the switch 71 is suppressed.

The metal block 72 is made of copper, for example. Alternatively, the metal block 72 may be made of metal other than copper (copper alloy, for example). Each of the metals forming the metal block 72 and the solder 50 (copper and tin alloy, for example) has a thermal conductivity that is some hundreds of times or more the thermal conductivity of molding resin used for forming the casing 77 on the upper side of the switch 71. For this reason, heat generated during the operation of the switch 71 is transferred not toward the upper surface of the switch 71 but toward the metal block 72 smoothly in a moment. As a result, temperature increase at the upper surface of the switch 71 is suppressed to a greater extent.

The aluminum electrode 90 is provided on the upper surface of the switch 71. As shown in FIG. 3, one end of the wire 78 is fixed to the electrode 90 on the switch 71. The wire 78 of the first preferred embodiment is an aluminum wire of a diameter from 125 to 500 μm. The other end of the wire 78 is fixed to the lead frame 76 described later. By doing so, the switch 71 is electrically connected through the wire 78 to the lead frame 76. Aluminum forming the electrode 90 on the switch 71 and forming the wire 78 has a thermal expansion coefficient that is about ten times or more the thermal expansion coefficient of silicon, meaning that it is significantly greater than that of silicon. For this reason, if the upper surface of the switch 71 made of silicon is placed in a high temperature during the operation of the ignition device 1, a difference in thermal expansion coefficient causes what is called "thermal stress of power cycle," and this thermal stress is concentrated on a boundary and its vicinity of the upper surface of the switch 71 with the wire 78 or the electrode 90. Putting the ignition device 1 into operation repeatedly causes a risk of the occurrence of a break or a crack at the boundary and its vicinity. In this regard, in the first preferred embodiment, the temperature increase is suppressed at the upper surface of the switch 71 as described above to prevent the occurrence of such a break or a crack.

As shown in FIG. 4, the metal block 72 has protrusions formed near the opposite ends of the metal block 72 in the front-back direction. These protrusions will hereinafter be called a "first protrusion 741" and a "second protrusion 742." Each of the protrusions 741 and 742 protrudes upward from the upper surface of the metal block 72. Further, the lead frame 75 made of metal is arranged and a through hole 750 is formed in the lead frame 75. The through hole 750 penetrates one end 91 of the lead frame 75 in an up-down direction. The first protrusion 741 is inserted into the through hole 750 formed in the lead frame 75 and is fixed by swaging. By doing so, the metal block 72 and the lead frame 75 become electrically connected to each other. Using the swaged configuration allows the metal block 72 to be fixed easily to the lead frame 75 without using a different member, thereby contributing to cost reduction. The other end 92 of the lead frame 75 is connected to the other end 812 of the primary conductor 81 forming the primary coil L1. Namely, the lead frame 75 connects the metal block 72 and the coil unit 103 electrically to each other.

As shown in FIG. 4, the one end 91 of the lead frame 75 has a level difference part 31. The one end 91 is located closer to the upper side than the other section of the lead frame 75. The metal block 72 is fixed to the lead frame 75 by swaging at the level difference part 31. This configuration allows the one end 91 of the lead frame 75 to be arranged more closer to the upper side. Namely, this configuration makes it possible to ensure a greater thickness of the metal block 72. As a result, the thermal capacity of the metal block 72 is increased further to allow a larger quantity of heat generated during the operation of the switch 71 to be absorbed in the metal block 72. Thus, temperature increase at the switch 71 is suppressed to a greater extent.

In addition to the lead frame 75, the plurality of different lead frames 76 each having a configuration comparable to that of the lead frame 75 are fixed in a corresponding part in the igniter 104. These different lead frames 76 are electrically connected through the different connection members 22 or the plurality of different wires 23 and 24, for example. The driving IC 73 and the electrode 90 on the switch 71 are electrically connected to each other through the wire 74. Regarding the lead frame 76 to which the second protrusion 742 of the metal block 72 is fixed by swaging (see FIG. 4) and the plurality of different lead frames 76, these lead frames 76 are used for retaining each part during resin molding of the casing 77 as described later, and are thereafter cut while some parts of the lead frames 76 are reserved.

The driving IC 73 is a controller that controls opening and closing of the switch 71 on the basis of an EST signal received from the ECU 105. The driving IC 73 includes a logical device connected to the switch 71. Examples of the logical device include a logic circuit, a processor, a complex programmable logic device (CPLD), a field-programmable gate array (FPGA), and an application-specific integrated circuit (ASIC), etc. The logical device performs operation processing for putting the ignition device 1 into operation and igniting the spark plug 113.

Figure 5:
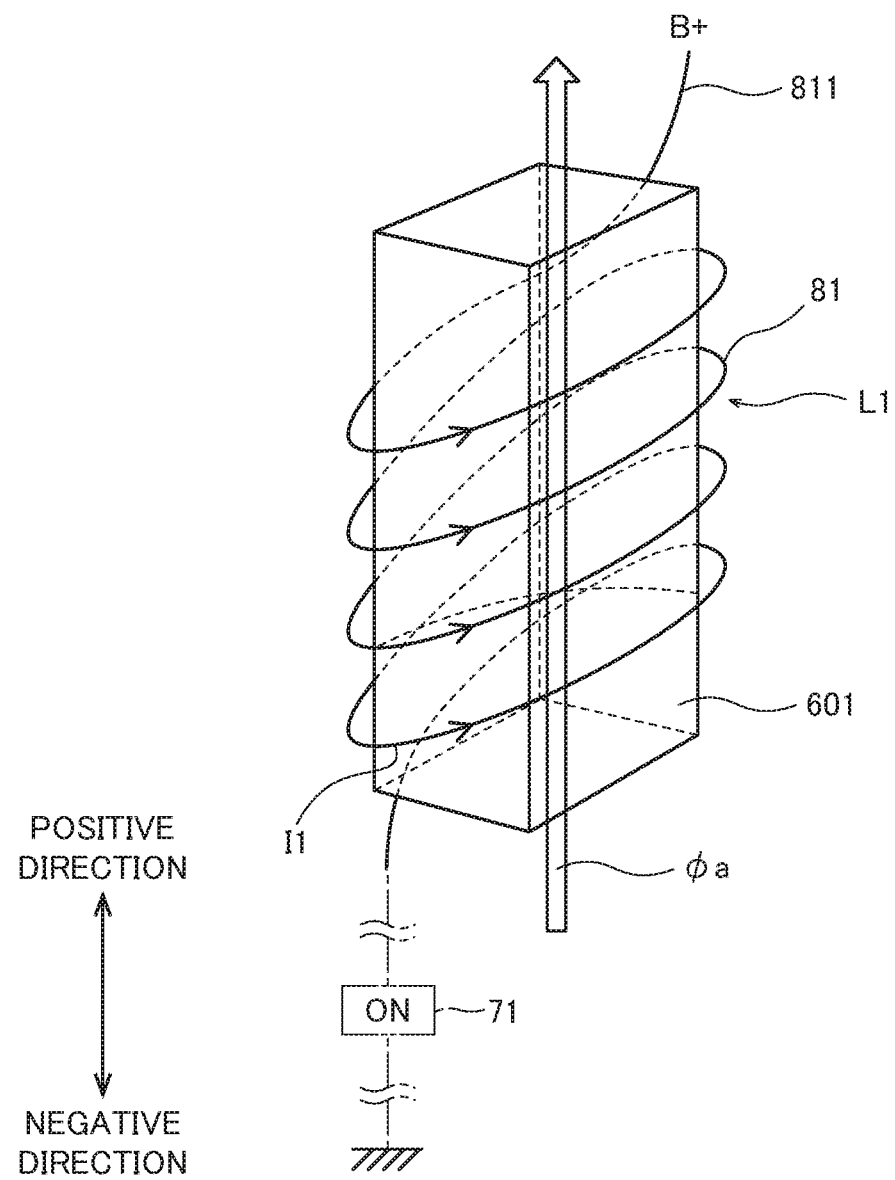
FIG. 5 is a perspective view schematically showing the direction of magnetic flux during charging control according to the first preferred embodiment.

For putting the coil unit 103 into operation, the driving IC 73 first closes the switch 71. At this time, a DC voltage (B+) from the battery 102 is applied to the primary coil L1 to cause the primary current I1 to flow in the primary conductor 81 forming the primary coil L1. FIG. 5 is a perspective view schematically showing the direction of the primary current I1 in the primary conductor 81 flowing at this time and the direction of magnetic flux generated at this time. As indicated by arrows in FIG. 5, in the first preferred embodiment, the primary current I1 flows in the primary conductor 81 in the anticlockwise direction (left-handed screw direction) as viewed from a positive direction. By the flow of the primary current I1 in the primary coil L1, electric charge is stored in the primary coil L1 (charging control). Further, current passage magnetic flux (φa in the positive direction indicated by a hollow arrow in FIG. 5 is generated, and a magnetic field responsive to the generated magnetic flux acts on the center iron core 601.

Figure 6:
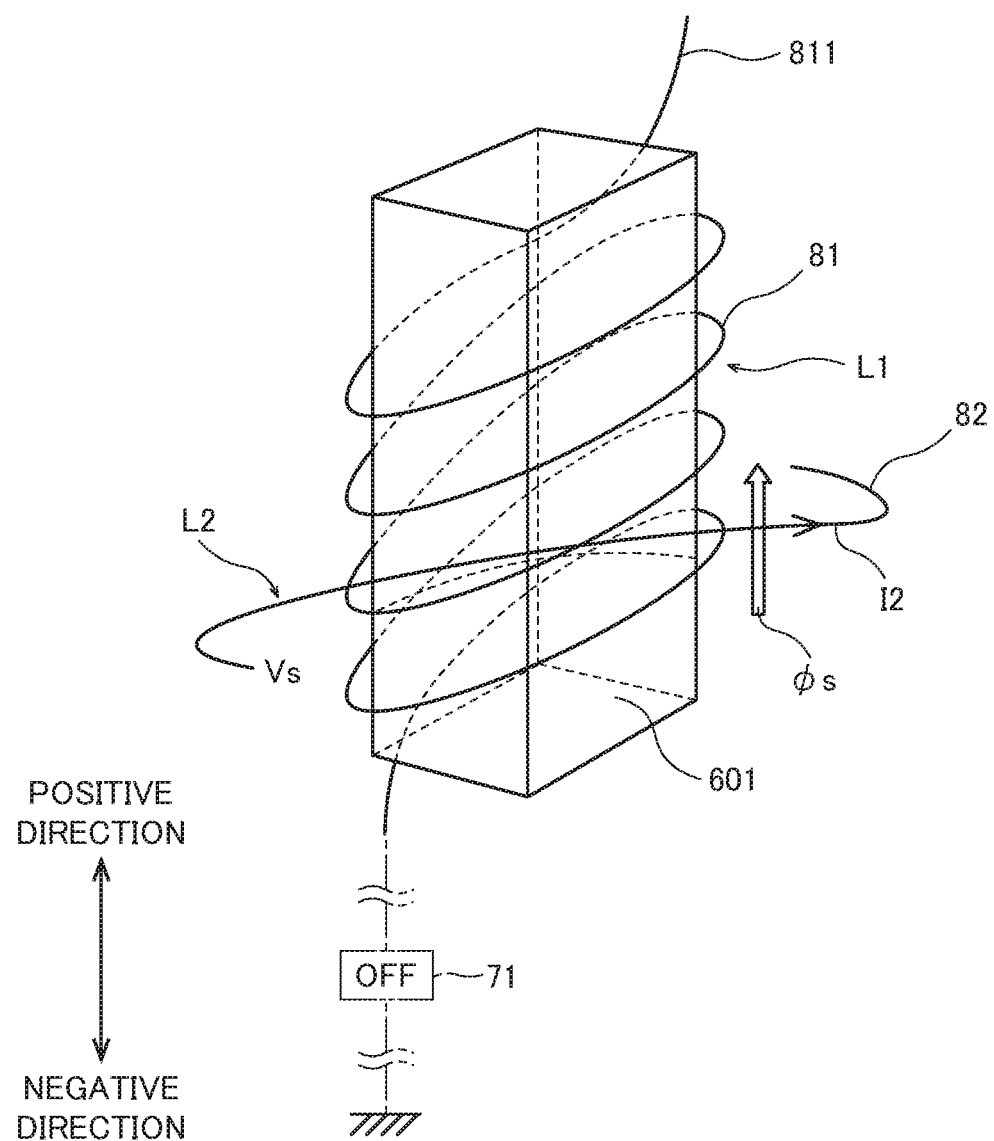
FIG. 6 is a perspective view schematically showing the direction of magnetic flux during interruption control according to the first preferred embodiment.

Next, the driving IC 73 changes the switch 71 from the closed state to an open state (interruption control) at the time when a predetermined period of time T has passed from start of the charging control described above. FIG. 6 is a perspective view schematically showing the direction of a secondary current I2 in the secondary coil L2 flowing at this time and the direction of magnetic flux generated at this time. As shown in FIG. 6, at this time, the primary current I1 is interrupted and the current passage magnetic flux (φa in the positive direction generated in the charging control described above changes to be reduced. Then, mutual induction action is generated in the secondary conductor 82 forming the secondary coil L2 and arranged external to the primary conductor 81 in the radial direction to cause the secondary current I2 to flow in a direction indicated by an arrow in FIG. 6. Then, interruption magnetic flux φs is generated in a direction (a direction indicated by a hollow arrow in FIG. 6 (positive direction)) in which change in the current passage magnetic flux φa is hindered to generate induced electromotive force Vs in the secondary coil L2.

As described above, the number of turns of the secondary conductor 82 of the secondary coil L2 (10000 turns, for example) is about 100 times the number of turns (100 turns, for example) of the primary conductor 81 of the primary coil L1. With this configuration, a high voltage is induced in the secondary coil L2 during the operation of the ignition device 1. This allows generation of an electric spark at the spark plug 113 to ignite fuel.

Referring back to FIG. 3, the casing 77 is molding resin accommodating the switch 71, the metal block 72, the driving IC 73, the wire 74, a part of the lead frame 75, parts of the plurality of different lead frames 76, the wire 78, the plurality of different elements 21, the plurality of different connection members 22, and the plurality of different wires 23 and 24. These different elements 21 include various types of elements such as a capacitor and a resistor for operating the ignition device 1 normally. The switch 71, the metal block 72, the driving IC 73, the lead frame 75, the different lead frames 76, and the different elements 21 are connected to each other directly and electrically. Alternatively, these elements may be connected to each other electrically and indirectly through the wire 74, the wire 78, the different connection members 22 (such as interconnect lines), or the different wires 23 and 24.

The casing 77 is an insert-molded article obtained by pouring molding resin into a mold retaining the switch 71, the metal block 72, the driving IC 73, the wire 74, a part of the lead frame 75, parts of the plurality of different lead frames 76, the wire 78, the plurality of different elements 21, the plurality of different connection members 22, and the plurality of different wires 23 and 24. For forming the casing 77 by resin molding, while the other part of the lead frame 75 and the other parts of the different lead frames 76 are retained and suspended in positions, the parts electrically connected to each other in a manner described above are accommodated inside the mold and the molding resin is poured into the mold. After the molding resin is cured, the mold is removed form the casing 77. Further, the switch 71, the metal block 72, the driving IC 73, the wire 74, the part of the lead frame 75, the parts of the different lead frames 76, and the wire 78 are covered by the single molding resin forming the casing 77 to be retained. The other end 92 of the lead frame 75 is exposed from the molding resin forming the casing 77.

2. Modifications

While the exemplary preferred embodiment of the present invention has been described hereinabove, the present invention is not limited to the foregoing preferred embodiment.

In the preferred embodiment described above, the switch 71 is fixed to the metal block 72 by soldering at the lower surface of the switch 71, and is electrically connected to the driving IC 73 at the upper surface of the switch 71. However, a surface of the switch 71 to be fixed to the metal block 72 is not limited to the lower surface. For example, the switch 71 may be fixed to the metal block 72 at a side surface of the switch 71. Also, a surface of the switch 71 to be electrically connected to the driving IC 73 is not limited to the upper surface. For example, the switch 71 may be electrically connected to the driving IC 73 at a different side surface of the switch 71. Namely, the switch 71 is required to be fixed to the metal block 72 by soldering at a surface of the switch 71 on one side, and to be electrically connected to the driving IC 73 at a surface of the switch 71 on the other side.

The ignition device including the igniter of the present invention may be any device installable on various types of devices or industrial machines such as power generators in addition to vehicles such as automobiles, and available for use for igniting fuel by generating electric sparks at spark plugs of internal combustion engines.

The detailed shape or configuration of the ignition device including the igniter described above can be changed appropriately within a range without deviating from the purport of the present invention. Additionally, the foregoing elements in the embodiment or modifications described above may be combined together, as appropriate, without inconsistencies.

What is claimed is:

1. An igniter that controls a current flowing in a coil unit for supplying a high voltage to a spark plug for use in an internal combustion engine, the igniter comprising:
   a metal block including an upper surface and a lower surface opposite said upper surface;
   a pyrogenic power element directly disposed on said upper surface of said metal block by soldering;
   a controller electrically connected to said pyrogenic power element to control the operation of said pyrogenic power element;
   a first lead frame which connects said metal block electrically to said coil unit; and
   a second lead frame to which said metal block is fixed,
   wherein said metal block has a first protrusion formed on said upper surface of said metal block to protrude upwardly from said upper surface of said metal block,
   wherein said first lead frame includes a first portion, a second portion, and a level difference part extending between said first portion and said second portion,
   wherein said first portion of said first lead frame includes a first through hole penetrating through said first portion such that said first lead frame is fixed to said upper surface of said metal block by inserting said first protrusion of said metal block into said first through hole of said first portion and by swaging a first end of said first protrusion,
   wherein, in a cross-sectional view, i) said first portion of said first lead frame is leveled with said pyrogenic power element on said upper surface of said metal block, and ii) said second portion of said first lead frame is disposed closer to said lower surface of said metal block than said first portion of said first lead frame is,
   wherein said metal block has a second protrusion, different from said first protrusion, formed on said upper surface of said metal block to protrude upwardly from said upper surface of said metal block,
   wherein said second lead frame includes a second through hole penetrating through said second lead frame such that said second lead frame is fixed to said metal block by inserting said second protrusion into said second through hole and by swaging a second end of said second protrusion, and
   wherein one end of said first lead frame is covered by single molding resin together with said metal block, said pyrogenic power element, said second lead frame, and said controller, and the other end of said first lead frame is exposed from said molding resin.

2. The igniter according to claim 1, wherein said metal block is made of copper or a copper alloy.

3. The igniter according to claim 1, wherein at least a part of said pyrogenic power element is made of silicon, and
   an aluminum wire is connected between a surface of said pyrogenic power element and said controller.

4. The igniter according to claim 1, wherein said pyrogenic power element is an IGBT arranged on a path of a current flowing in said coil unit.

5. The igniter according to claim 1, wherein
   said first end portion has a diameter greater than a diameter of an opening of said first through hole,
   said first end portion and said upper surface of said metal block sandwich said first lead frame, and
   said second end portion has a diameter greater than a diameter of an opening of said second through hole, and
   said second end portion and said upper surface of said metal block sandwich said second lead frame.

6. The igniter according to claim 5, wherein said metal block including said first protrusion and said second protrusion is formed of a single member.

* * * * *